(12) United States Patent
Shiah

(10) Patent No.: US 6,861,877 B2
(45) Date of Patent: Mar. 1, 2005

(54) CIRCUIT TO INDEPENDENTLY ADJUST RISE AND FALL EDGE TIMING OF A SIGNAL

(75) Inventor: Chun Shiah, Hsin-Chu (TW)

(73) Assignee: Etron Technology, Inc., Hsin-Chu (TW)

( * ) Notice: Subject to any disclaimer, the term of this patent is extended or adjusted under 35 U.S.C. 154(b) by 50 days.

(21) Appl. No.: 10/346,587

(22) Filed: Jan. 17, 2003

(65) Prior Publication Data

US 2004/0140832 A1 Jul. 22, 2004

(51) Int. Cl.[7] .................................................. H03K 5/04
(52) U.S. Cl. ....................................... 327/34; 327/176
(58) Field of Search ............................. 327/34, 172–175

(56) References Cited

U.S. PATENT DOCUMENTS

| | | | | |
|---|---|---|---|---|
| 6,069,511 | A | 5/2000 | Mohan | 327/171 |
| 6,222,403 | B1 * | 4/2001 | Mitsuda | 327/170 |
| 6,249,150 | B1 * | 6/2001 | Matsui | 326/93 |
| 6,294,939 | B1 | 9/2001 | McClure | 327/172 |
| 6,313,681 | B1 | 11/2001 | Yoshikawa | 327/277 |
| 6,433,603 | B1 * | 8/2002 | Singh et al. | 327/211 |

* cited by examiner

Primary Examiner—Kenneth B. Wells
(74) Attorney, Agent, or Firm—George O. Saile; Stephen B. Ackerman; Douglas R. Schnabel

(57) ABSTRACT

A circuit to independently control rise and fall delay edge timing of a signal is achieved. The circuit comprises, first, a first delay element and a second delay element. Each of the delay elements has an input and an output. Each of the inputs is coupled to a common, input signal. Next, an AND function, having two inputs and one output, is used. One of the AND inputs is coupled to the input signal, and another of the AND inputs is coupled to the first delay element output. The AND function output comprises a rise-delayed signal having a controlled rising edge delay between a rising edge of the input signal and a rising edge of the rise-delay signal. Finally, an OR function, having two inputs and one output, is used. One of the OR inputs is coupled to the input signal, and another of the OR inputs is coupled to the second delay element output. The OR function output comprises a fall-delayed signal having a controlled falling edge delay between a falling edge of the input signal and a falling edge of the fall-delay signal. A means of combining the rise-delayed signal and the fall-delayed signal into a common, delayed output signal is also disclosed.

16 Claims, 6 Drawing Sheets

CIRCUIT TO INDEPENDENTLY ADJUST RISE AND FALL EDGE TIMING OF A SIGNAL

BACKGROUND OF THE INVENTION

(1) Field of the Invention

The invention relates to an input buffer circuit, and, more particularly, to a circuit to independently adjust rise and fall edge timing of a signal.

(2) Description of the Prior Art

Signal conditioning must be performed on most inputs to an integrated circuit device. Referring to FIG. 1 an example of an IC device 10 is shown. In this very simplified system, an input, SIGNAL 14, appears at an external pin of the device 10. An input circuit, or input buffer circuit, resides in the IC device 10 as the series of inverters I1 22 and I2 26. The internal signal, SIGNAL_IC 18, is generated by the input signal SIGNAL 14.

Each of the inverters 22 and 26 comprise transistor devices. These transistor devices, not shown, require a finite time for switching states. This switching time is usually called a delay time, or an edge delay time. The timing diagram of FIG. 1 shows some typical waveforms for SIGNAL 14 and SIGNAL_OUT 18. A transition of SIGNAL 14 from low to high creates a rising edge. SIGNAL_OUT 18 follows this rising edge with a similar rising edge transition. The time delay between the rising edge of SIGNAL 14 and the rising edge of SIGNAL_OUT 18 is defined as the rising edge time delay ($T_r$) for circuit. Similarly, the falling edge time delay is shown by $T_f$.

In many applications of an input circuit, the edge timing delays are a critical parameter. More particularly, in systems such as asynchronous devices or double data rate (DDR) DRAM devices, critical device operation is timed from edge transitions. This means that the edge delay for rising and falling edges needs to be carefully controlled. An even more important consideration to the present invention is the need to control the rising edge delay $T_r$ and the falling edge delay $T_r$ independently. The prior art buffer circuit shown is not well suited for providing independent edge delay control. Methods to tailor the edge delay of this simple inverter circuit are known in the art. However, such methods do not allow the rising and falling edge delays to be independently altered. For example, attempts to increase the falling edge delay either will cause a decrease in the rising edge delay or will cause an increase in the rising edge delay that mirrors that for the falling edge delay.

Several prior art inventions relate to methods and circuits for input buffering and edge delay. U.S. Pat. No. 6,294,939 to McClure describes a method and a circuit for data input buffering. Separate paths for rising edge and for falling edge propagation are shown. However, the circuit is designed to filter out noise from the data input, and the rise and fall delays are designed to be substantially the same. U.S. Pat. No. 6,313,681 to Yoshikawa discloses a variable delay circuit. A delay element comprising a comparator is used in each of the positive and the negative delay paths. U.S. Pat. No. 6,069,511 to Mohan teaches a method and circuit to control signal rise/fall times using slew rate.

SUMMARY OF THE INVENTION

A principal object of the present invention is to provide an effective and very manufacturable circuit to independently control rise and fall delay edge timing of a signal.

A further object of the present invention is to provide a circuit where independent delay elements are used for the rising and the falling edge delays.

A yet further object of the present invention is to control the rising and falling edge delays using separate strings of inverters.

A still yet further object of the present invention is to customize the delay in the inverter strings by adding inverters, by adding capacitance, or by using unbalanced inverter sizes.

Another further object of the present invention is to provide a means of combining the rise-delayed signal and the fall-delayed signal into a common, delayed output signal.

In accordance with the objects of this invention, a circuit to independently control rise and fall delay edge timing of a signal is achieved. The circuit comprises, first, a first delay element and a second delay element. Each of the delay elements has an input and an output. Each of the inputs is coupled to a common, input signal. Next, an AND function, having two inputs and one output, is used. One of the AND inputs is coupled to the input signal, and another of the AND inputs is coupled to the first delay element output. The AND function output comprises a rise-delayed signal having a controlled rising edge delay between a rising edge of the input signal and a rising edge of the rise-delay signal. Finally, an OR function, having two inputs and one output, is used. One of the OR inputs is coupled to the input signal, and another of the OR inputs is coupled to the second delay element output. The OR function output comprises a fall-delayed signal having a controlled falling edge delay between a falling edge of the input signal and a falling edge of the fall-delay signal. A means of combining the rise-delayed signal and the fall-delayed signal into a common, delayed output signal is also achieved.

Also in accordance with the objects of the present invention, a method to independently control rise and fall delay edge timing of a signal is achieved. The method comprises, first, generating a first delay signal based on an input signal. A second delay signal is generated based on the input signal. The generating of the first and second delay signals comprises separate strings of inverter gates. A logical AND signal is generated based on the input signal and the first delay signal.

The logical AND signal comprises a rise-delayed signal having a controlled rising edge delay between a rising edge of the input signal and a rising edge of the rise-delay signal. Finally, a logical OR signal is generated based on the input signal and the second delay signal. The logical OR signal comprises a fall-delayed signal having a controlled falling edge delay between a falling edge of the input signal and a falling edge of the fall-delay signal.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a circuit to independently control rise and fall delay edge timing of a signal. Further, techniques to alter the delay timing of each independent delay element are disclosed.

Finally, an embodiment with a means of combining the rise-delayed signal and the fall-delayed signal into a common, delayed output signal is described. It should be clear to toe experienced in the art that the present invention can be applied and extended without deviating from the scope of the present invention.

Figure 1:
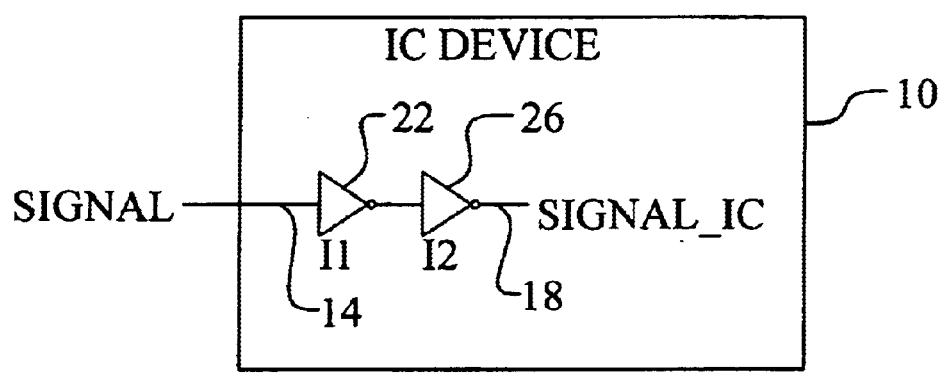
FIG. 1 illustrates a prior art input buffer circuit.
Figure 1:
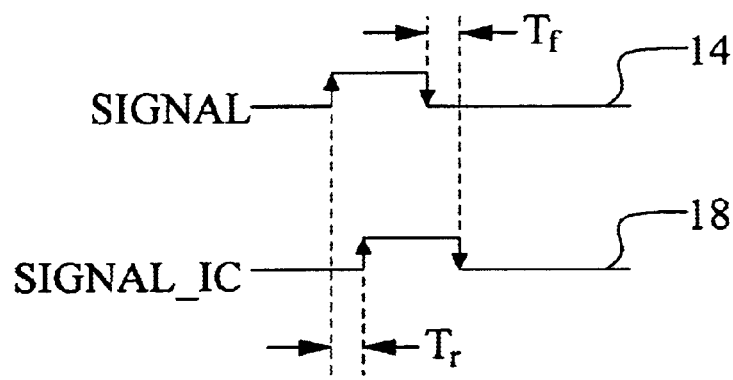
Figure 2:
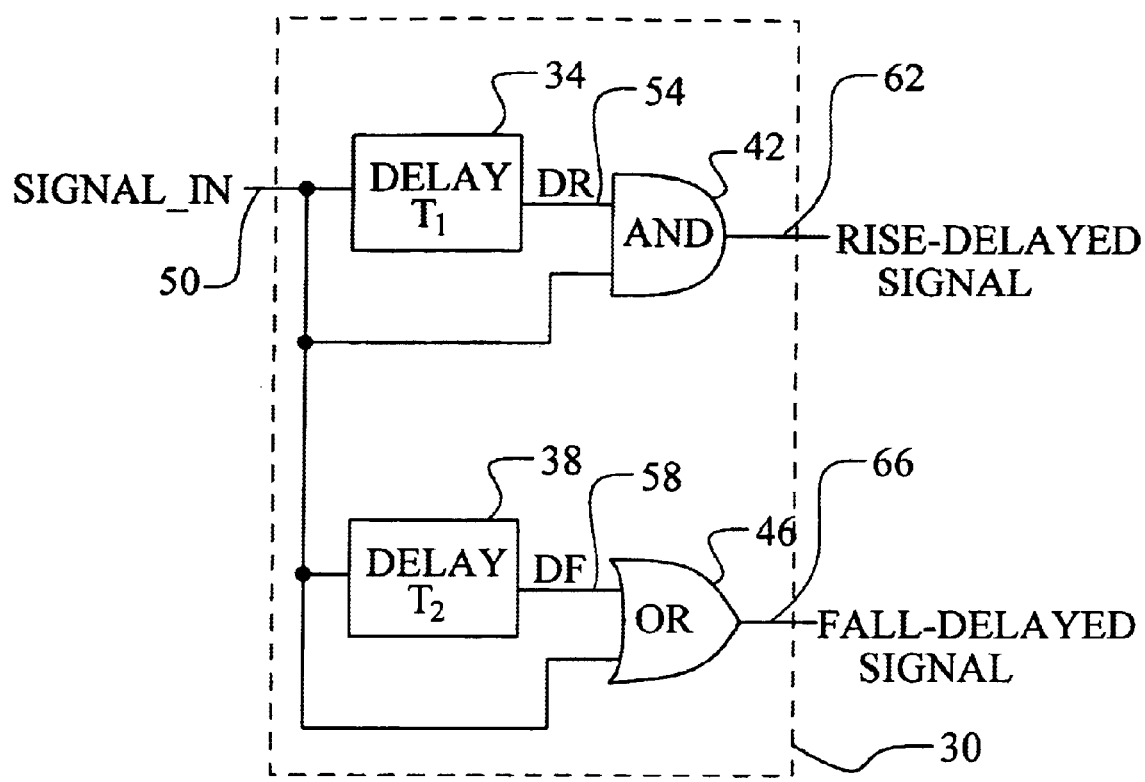
FIG. 2 illustrates the preferred embodiment of the present invention circuit to independently control rise and fall delay edge timing of a signal.
Figure 2:
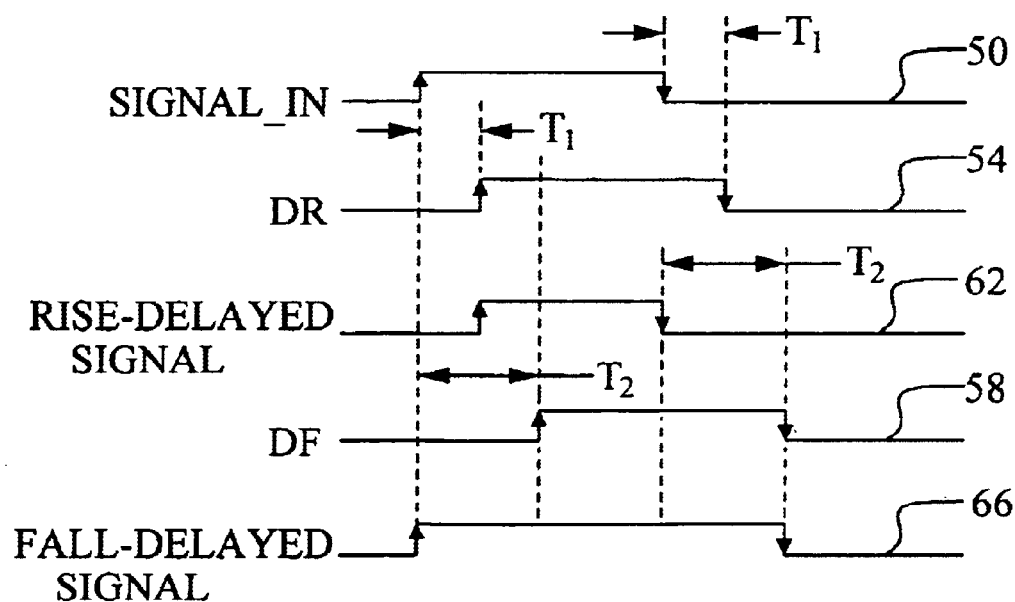

Referring now to FIG. 2, the preferred embodiment of the present invention is shown. Several important features of the present invention are shown in the illustration and are further describe below. The present invention comprises a circuit 30 to independently control rise and fall delay edge timing of a signal 50. More specifically, the circuit 30 comprises first, a first delay element 34 and a second delay element 38. Each of the delay elements 34 and 38 has an input and an output. Each of the delay element inputs is coupled to a common, input signal SIGNAL_IN 50.

As an important feature of the present invention, the delay elements 34 and 38 provide two, independent delay paths for propagating SIGNAL_IN 50. The first delay element 34 has a fixed delay of $T_1$ and generates the output DR 54. The timing diagram shows exemplary behavior of the present invention circuit. The input signal, SIGNAL_IN 50, exhibits a transition from low to high and, then, from high to low. The first delay output DR 54 mirrors the behavior of SIGNAL_IN 50 but includes a fixed delay of $T_1$ for both the rising and the falling edges. The second delay element 38 has a fixed delay of $T_2$ and generates the output DF 58. The typical performance of the DF signal is shown in the timing diagram. Note that DF 58 mirrors SIGNAL_IN 50 but includes the fixed delay $T_2$ for the rise and fall edge transitions. Further, note that since $T_1$ and $T_2$ are independent, different delay values can be chosen as demonstrated by the timing diagram.

Next, as an important feature of the present invention, an AND function 42, having two inputs and one output, is used. One of the AND 42 inputs is coupled to the input signal SIGNAL_IN 50. The other of the AND 42 inputs is coupled to the first delay element output DR 54. The AND function 42 output comprises a RISE-DELAYED SIGNAL 62. Referring to the timing diagram, the RISE-DELAYED SIGNAL 62 has a controlled rising edge delay $T_1$ between a rising edge of SIGNAL_IN 50 and a rising edge of the RISE-DELAYED SIGNAL 62. The AND function 42 applies the delay $T_1$ to only the rising edge of the output 62. The falling edge of the output 62 is aligned to the input signal SIGNAL_IN 50 assuming that the small delay of the AND function 42 is ignored.

Finally, as an important feature of the present invention, an OR function 46, having two inputs and one output, is used.

One of the OR 46 inputs is coupled to SIGNAL_IN 50. The other of the OR 46 inputs is coupled to the second delay element 38 output. The OR function 46 output comprises the FALL-DELAYED SIGNAL 66. As shown on the timing diagram, the OR function 46 causes the falling edge delay $T_2$ on DF 58 to be applied to the output 66. The rising edge delay $T_2$ of DF 58 is ignored. The FALL-DELAYED SIGNAL 66 has a controlled falling edge delay $T_2$ between a falling edge of the input signal 50 and a falling edge of the fall-delay signal 66.

This circuit is especially applicable to input buffering and conditioning of memory or other digital control signals. In particular, the control signals for a DDR DRAM device may be optimal conditioned using the circuit of the present invention. In addition, graphic controllers or other DRAM devices, such as EDO or SDRAM may benefit from this input conditioning.

Figure 3:
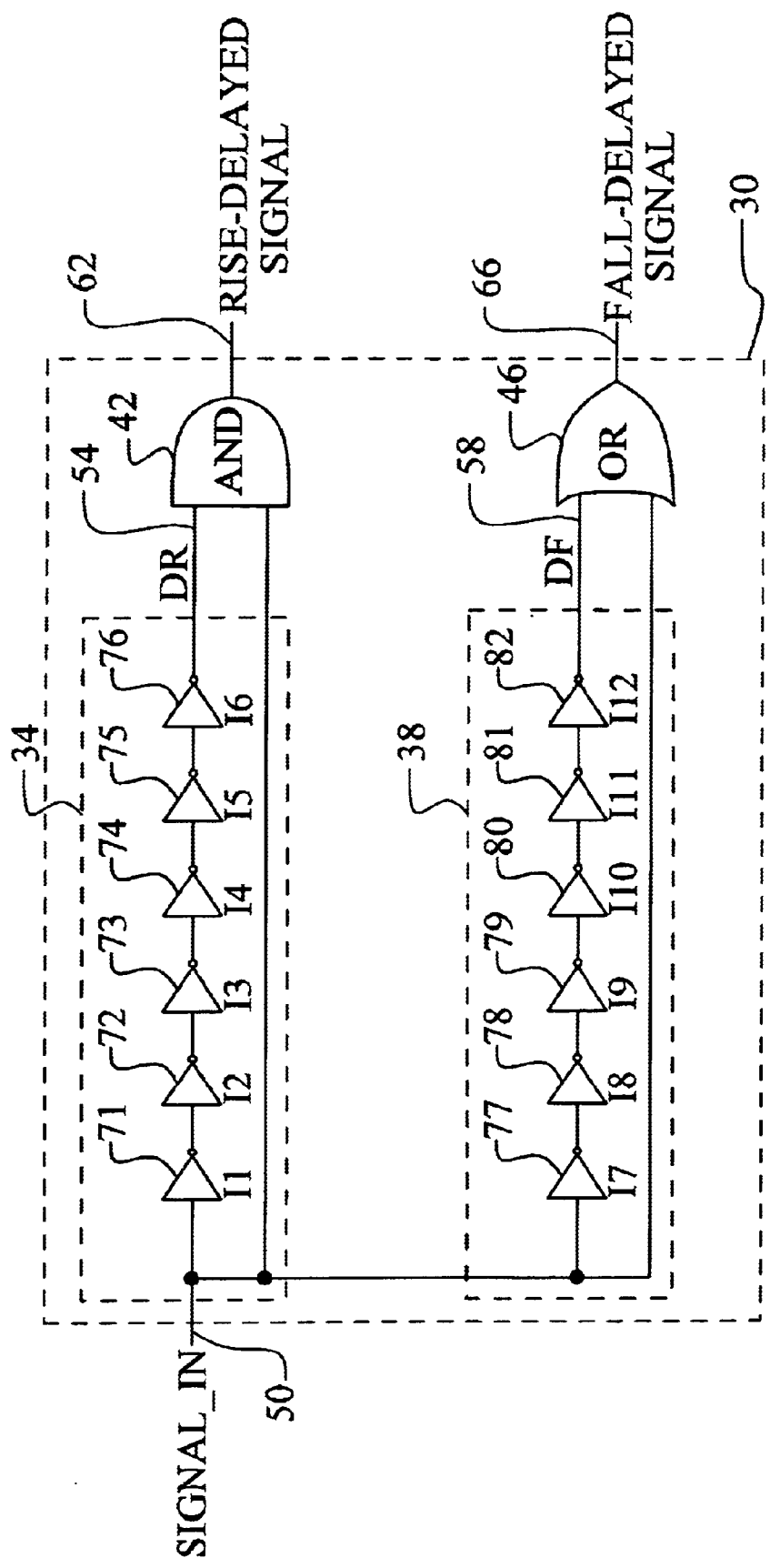
FIG. 3 illustrates the preferred embodiment of the delay elements of the present invention.

Referring now to FIG. 3, the preferred embodiment of the delay elements of the present invention is illustrated. The circuit 30 of FIG. 3 illustrates the preferred use of inverter strings, or chains, for the delay elements 34 and 38 of the circuit of FIG. 2. All other elements of the FIG. 3 circuit are identical to the FIG. 2 circuit. Referring again to the FIG. 3 circuit 30, the first delay element 34 is constructed of an inverter string herein comprising the six inverters I1 71 through I6 76. The second delay element 38 is constructed of an inverter string herein comprising the six inverters I7 77 through I12 82. While the preferred embodiment shows a six-inverter string, any even-number string of inverters could be used. The key idea is to provide a two, substantially long, independent delays between the input SIGNAL 50 and the outputs DR 54 and DF 58.

Figure 4:
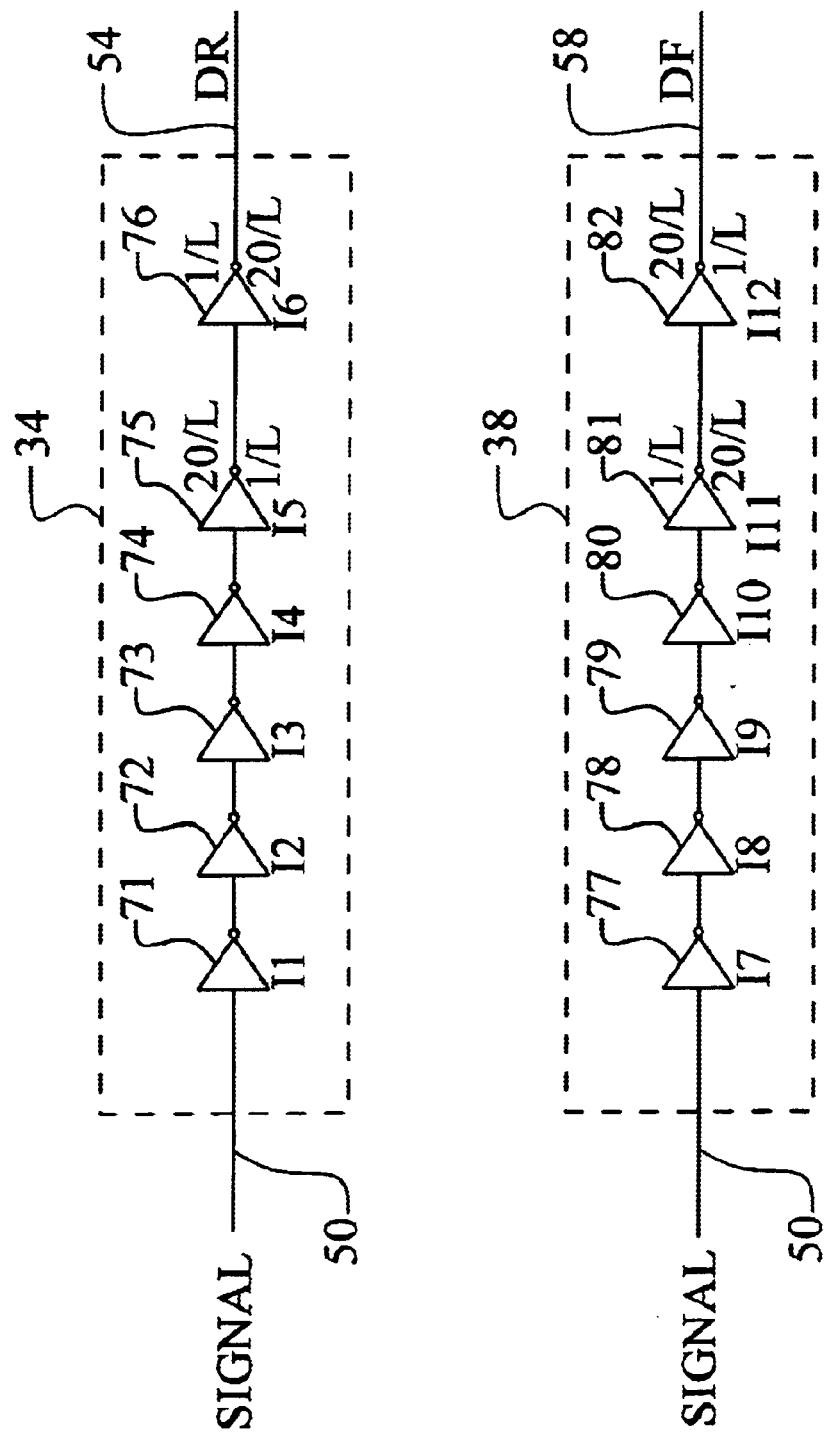
FIG. 4 illustrates customizing delay elements using unbalanced transistor ratios in the inverters.

The inverter string-based delay element concept may be extended in several ways. Referring now to FIG. 4, the first delay element 34 and the second delay element 38 can be customized to create specific delays using unbalanced transistor ratios in the inverters. If the integrated circuit device is manufactured using a CMOS process, then each of the inverters I1–I12 comprises a pair of transistors and, more particularly, an NMOS transistor and a PMOS transistor. Due to the differing mobility of the bulk material in the NMOS and PMOS devices, the PMOS transistor must typically have a larger size than the NMOS device. For example, if the process is tuned to a 2:1 ratio, then a NMOS transistor with a width of 3 microns and a length of 1 micron would require a PMOS device having a width of 6 microns and a length of 1 micron in order to achieve balanced switching. With a 2:1 ratio, under nominal conditions, the inverter will symmetrically switch and will exhibit the same delay for rising and falling transitions.

In the example case, the last two inverters of the first delay element 34, I5 75 and I6 76, comprise unbalanced transistor pairs. I5 75 comprises a ratio of N W/L to P W/L of about 1:20. I6 76 comprises a ratio of N W/L to P W/L of about 20:1. The combination of the unbalanced inverters I5 and I6 causes the rising edge transition for DR 54 to be substantially slowed. In this way, the first delay element 34 can be tailored to have an especially slow rising edge transition. Similarly, the last two inverters, I11 81 and I12 82, of the second delay element 38 may comprise ratios that slow the falling edge transition.

Figure 5:
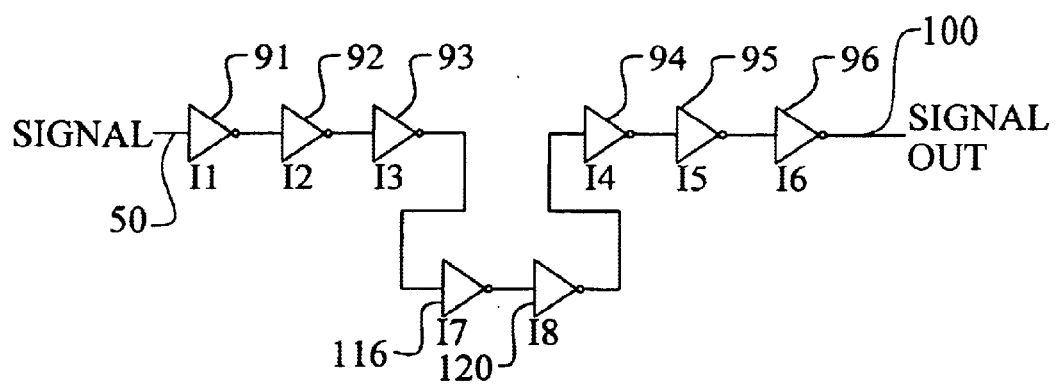
FIG. 5 illustrates customizing delay elements using additional inverters.
Figure 6:
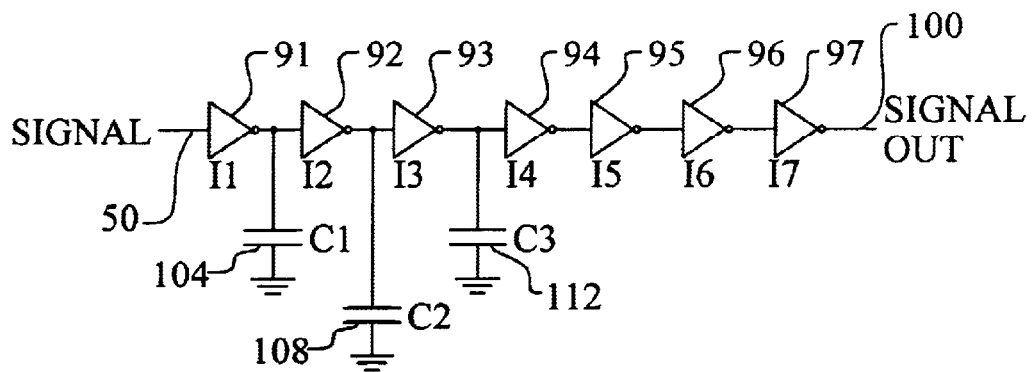
FIG. 6 illustrates customizing delay elements using node capacitance.

Referring now to FIG. 5, a second method of adding delay to the delay elements is shown. In this case, the example delay string of six inverters, I1 91 through I6 96, is lengthened by adding two inverters, I7 116 and I8 120. This concept may be extended by adding any even number of inverters to the string to create the delay times needed for either the first or the second delay paths. Referring now to FIG. 6, a third method of adding delay to the delay element paths is shown. In this case, capacitance, C1 104 through C3 112, is added to nodes in the inverter string. This capacitance adds to the parasitic capacitance due to the transistor gates and junctions. The additional capacitance loading slows inverter switching and adds delay to the path from SIGNAL 50 to SIGNAL OUT 100.

Figure 7:
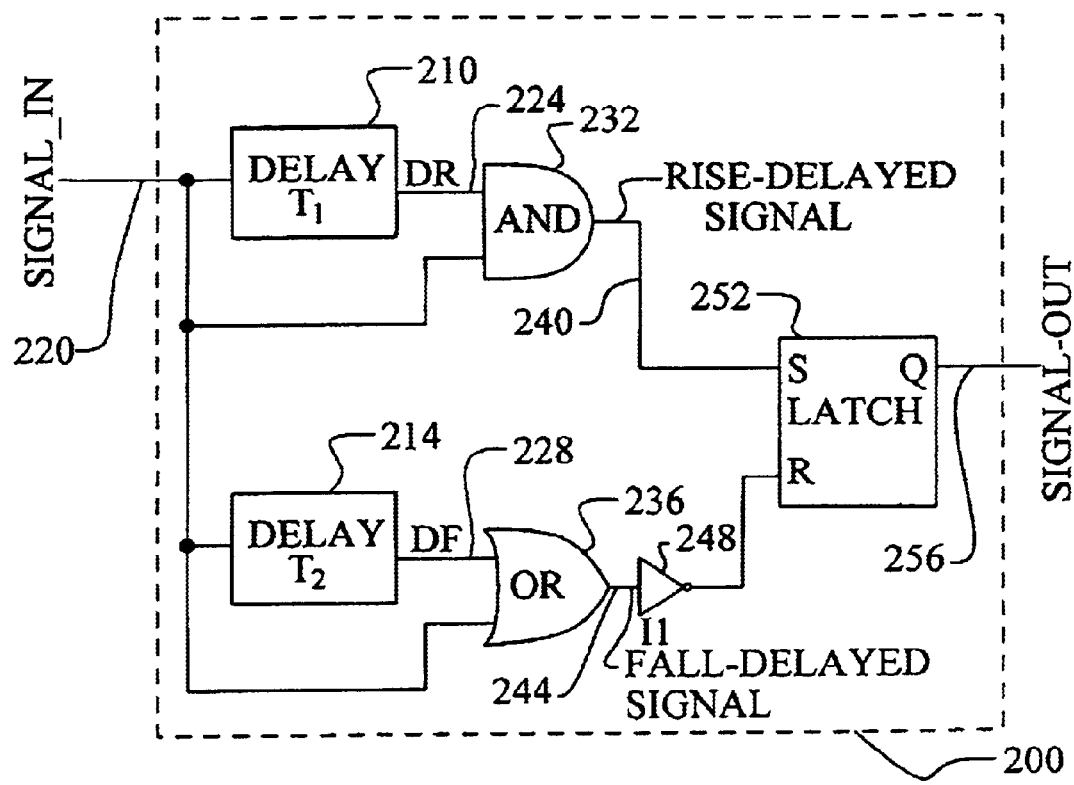
FIGS. 7 and 8 illustrate the preferred embodiment of the present invention with a means of combining the rise-delayed signal and the fall-delayed signal into a common, delayed output signal.
Figure 8:
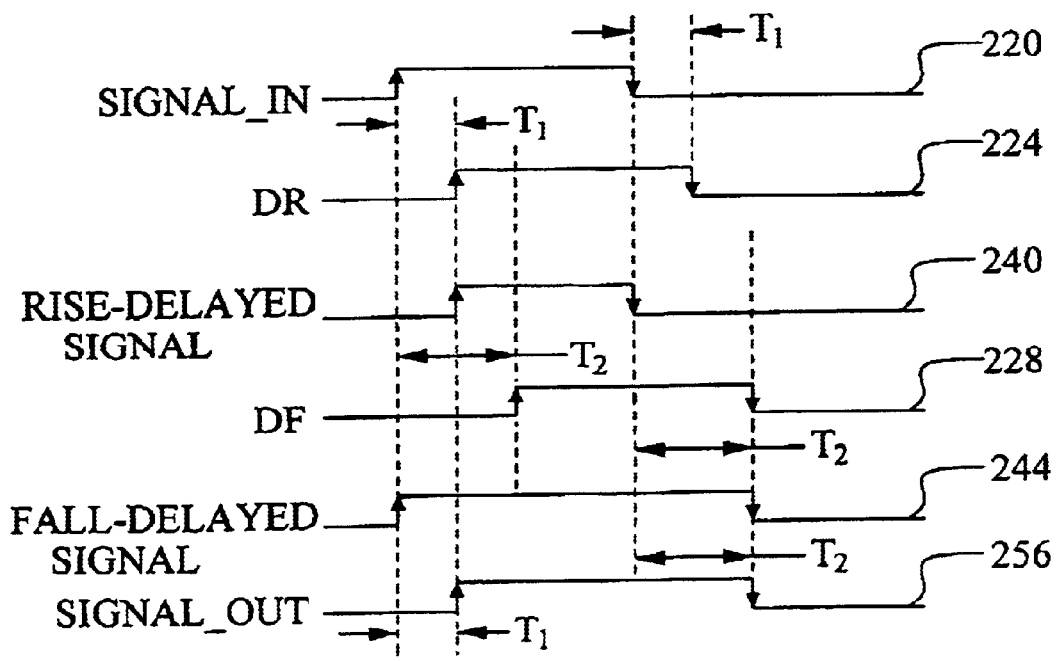

Referring now to FIGS. 7 and 8, the preferred embodiment of the present invention with a means of combining 252 the rise-delayed signal 240 and the fall-delayed signal 244 into a common, delayed output signal is shown. This embodiment is an extension of the novel concepts of the invention and provides an additional advantage. This circuit 200 comprises, first, the elements of the preferred embodiment of FIG. 2. Specifically, a first delay element 210 and a second delay element 214 are used. Each of the delay elements 210 and 214 is coupled to a common, input signal, SIGNAL_IN 220. Next, an AND function 232 is used. One of the AND inputs is coupled to SIGNAL_IN 220, and the other of the AND inputs is coupled to the first delay element 210 output, DR 224. The AND function 232 output comprises the RISE-DELAYED SIGNAL 240 having a controlled rising edge delay T1 between a rising edge of the input signal 220 and a rising edge of the rise-delay signal 240. Finally, an OR function 236 is used. One of the OR 236 inputs is coupled to the input signal 220, and another of the OR 236 inputs is coupled to the second delay element output, DF 228. The OR function 236 output comprises a FALL-DELAYED SIGNAL 244 having a controlled falling edge delay $T_2$ between a falling edge of the input signal 220 and a falling edge of the fall-delay signal 244.

Most importantly, a means of combining the RISE-DELAYED SIGNAL 240 and the FALL-DELAYED SIGNAL 244 is added to the circuit 200. This means of combining preferably comprises a latch 252 and, more preferably, comprises an S-R latch 252 combined with an inverter I1 248. This embodiment of the present invention represents an extension of the novel concept of using two delay paths 210 and 214 and the logic gates 232 and 236. The RISE-DELAYED SIGNAL 240 and the FALL-DELAYED SIGNAL 244 can be combined to form a SIGNAL_OUT 256 comprising the preferred delay timing. Specifically, the S-R latch 252 set is coupled to the RISE-DELAYED SIGNAL 240, the reset is coupled to the FALL-DELAYED SIGNAL 244 through the inverter I1 248, and the S-R latch 252 output forms the SIGNAL_OUT 256. It should be understood by one skilled in the art that other techniques for combining the delay signals could be used. The use of an S-R flip flop is only one exemplary means of combining the signals.

Referring now to FIG. 8, the timing diagram for the embodiment of FIG. 7 is shown. The timing performance for SIGNAL_IN 220, DR 224, RISE-DELAYED SIGNAL 240, DF 228, and , FALL-DELAYED SIGNAL 244 are the same as in FIG. 2. However, the SIGNAL_OUT signal 256 performance is added to the timing diagram. Because of the unique configuration, the circuit 200 guarantees that the possible state combinations of the RISE-DELAYED SIGNAL 240 and the FALL-DELAYED SIGNAL 244 are '00', '01', and '11'. The '10' state is not possible. With the inversion of the FALL-DELAYED SIGNAL 244 using I1 248, the possible S-R states are '01', '00' and '10' such that the S-R latch will generate SIGNAL_OUT 256 having the rising edge delay $T_1$ and having the falling edge delay $T_2$ as shown.

The advantages of the present invention may now be summarized. An effective and very manufacturable circuit to independently control rise and fall delay edge timing of a signal is achieved. The circuit uses independent delay elements for establishing the rising edge and the falling edge delays. Rising and falling edge delays are controlled using separate strings of inverters. The delay in the inverter strings may be customized by adding inverters, by adding capacitance, or by using unbalanced inverter sizes. Finally, a means of combining the rise-delayed signal and the fall-delayed signal into a common, delayed output signal is achieved.

As shown in the preferred embodiments, the novel circuit to independently control rise and fall delay edge timing of a signal provides an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit to independently control rise and fall delay edge timing of a signal, said circuit comprising:
    a first delay element and a second delay element wherein each of said delay elements has input and output and wherein each of said inputs is coupled to a common, input signal;
    an AND function having two inputs and one output wherein one of said inputs is coupled to said input signal and another of said inputs is coupled to said first delay element output and wherein said AND function output comprises a rise-delayed signal having a controlled rising edge delay between a rising edge of said input signal and a rising edge of said rise-delay signal;
    an OR function having two inputs and one output wherein one of said inputs is coupled to said input signal and another of said inputs is coupled to said second delay element output, wherein said OR function output comprises a fall-delayed signal having a controlled falling edge delay between a falling edge of said input signal and a falling edge of said fall-delay signal; and
    a means to combine said rise-delayed signal and said fall-delayed signal into a common, delayed output signal wherein said means of combining comprises a latch having set, reset, and output, and wherein said rise-delayed signal is coupled to set, said fall-delayed signal is coupled to reset, and said common, delayed output signal is coupled to output.

2. The circuit according to claim 1 wherein said input signal comprises a control signal for a digital circuit device.

3. The circuit according to claim 1 wherein said first and second delay elements comprise separate strings of inverter gates.

4. The circuit according to claim 3 further comprising capacitance loads on nodes in said inverter strings.

5. The circuit according to claim 3 wherein said controlled rising and falling edge delays comprise different values that are determined by the number of said inverters in each said inverter string.

6. The circuit according to claim 3 wherein said controlled rising and falling edge delays comprise different values that are determined by unbalanced PMOS to NMOS transistor ratios in said inverter strings.

7. A circuit to independently control rise and fall delay edge timing of a signal, said circuit comprising:
    a first delay element and a second delay element wherein each of said delay elements has input and output, wherein each of said inputs is coupled to a common, input signal, wherein each of said delay elements comprise separate strings of inverter gates;

an AND function having two inputs and one output wherein one of said inputs is coupled to said input signal and another of said inputs is coupled to said first delay element output and wherein said AND function output comprises a rise-delayed signal having a controlled rising edge delay between a rising edge of said input signal and a rising edge of said rise-delay signal;

an OR function having two inputs and one output wherein one of said inputs is coupled to said input signal and another of said inputs is coupled to said second delay element output, wherein said OR function output comprises a fall-delayed signal having a controlled falling edge delay between a falling edge of said input signal and a falling edge of said fall-delay signal; and a means to combine said rise-delayed signal and said fall-delayed signal into a common, delayed output signal wherein said means of combining comprises a latch having set, reset, and output, and wherein said rise-delayed signal is coupled to set, said fall-delayed signal is coupled to reset, and said common, delayed output signal is coupled to output.

8. The circuit according to claim 7 wherein said input signal comprises a control signal for a digital circuit device.

9. The circuit according to claim 7 wherein said controlled rising and falling edge delays comprise different values that are determined by the number of said inverters in each said inverter string.

10. The circuit according to claim 7 wherein said controlled rising and falling edge delays comprise different values that are determined by unbalanced PMOS to NMOS transistor ratios in said inverter strings.

11. The circuit according to claim 7 further comprising capacitance loads on nodes in said inverter strings.

12. A method to independently control rise and fall delay edge timing of a signal, said method comprising:

generating a first delay signal based on an input signal;

generating a second delay signal based on said input signal wherein said generating of said first and second delay signals comprises separate strings of inverter gates;

generating a logical AND signal based on said input signal and said first delay signal wherein said logical AND signal comprises a rise-delayed signal having a controlled rising edge delay between a rising edge of said input signal and a rising edge of said rise-delay signal;

generating a logical OR signal based on said input signal and said second delay signal wherein said logical OR signal comprises a fall-delayed signal having a controlled falling edge delay between a falling edge of said input signal and a falling edge of said fall-delay signal; and combining said rise-delayed signal and said fall-delayed signal into a common, delayed output signal wherein said combining comprises a latch having set, reset, and output, and wherein said rise-delayed signal is coupled to set, said fall-delayed signal is coupled to reset, and said common, delayed output signal is coupled to output.

13. The method according to claim 12 wherein said input signal comprises a control signal for a digital circuit device.

14. The method according to claim 12 wherein said controlled rising and falling edge delays comprise different values that are determined by the number of said inverters in each said inverter string.

15. The method according to claim 12 wherein said controlled rising and falling edge delays comprise different values that are determined by unbalanced PMOS to NMOS transistor ratios in said inverter strings.

16. The circuit according to claim 12 further comprising capacitance loads on nodes in said inverter strings.

* * * * *